United States Patent
Li et al.

(10) Patent No.: US 12,225,735 B2
(45) Date of Patent: Feb. 11, 2025

(54) SELECTOR FOR MEMORY DEVICE

(71) Applicant: Taiwan Semiconductor Manufacturing Company, Ltd., Hsinchu (TW)

(72) Inventors: Hung-Ju Li, Hsinchu (TW); Kuo-Pin Chang, Hsinchu (TW); Yu-Wei Ting, Taipei (TW); Ching-En Chen, Chiayi (TW); Kuo-Ching Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 430 days.

(21) Appl. No.: 17/833,907

(22) Filed: Jun. 7, 2022

(65) Prior Publication Data

US 2023/0397440 A1 Dec. 7, 2023

(51) Int. Cl.
*H10B 63/00* (2023.01)

(52) U.S. Cl.
CPC .................................... *H10B 63/24* (2023.02)

(58) Field of Classification Search
None
See application file for complete search history.

(56) References Cited

U.S. PATENT DOCUMENTS

| | | | | |
|---|---|---|---|---|
| 9,741,764 B1* | 8/2017 | Terai | ...................... | H10B 63/84 |
| 2007/0158698 A1* | 7/2007 | Dennison | ............... | H10N 70/20 |
| | | | | 257/246 |
| 2010/0163817 A1* | 7/2010 | Savransky | ............. | H10B 63/80 |
| | | | | 438/102 |
| 2017/0117327 A1* | 4/2017 | Terai | .................... | H01L 23/5221 |
| 2018/0047784 A1 | 2/2018 | Ohba et al. | | |
| 2019/0363134 A1 | 11/2019 | Ohba et al. | | |
| 2020/0335696 A1 | 10/2020 | Fantini et al. | | |
| 2021/0184117 A1 | 6/2021 | Verdy | | |

FOREIGN PATENT DOCUMENTS

| | | |
|---|---|---|
| TW | 201138110 A | 11/2011 |
| TW | 201541527 A | 11/2015 |
| TW | 201801362 A | 1/2018 |
| TW | 201805813 A | 2/2018 |
| TW | 201834290 A | 9/2018 |
| TW | 202218169 A | 5/2022 |

OTHER PUBLICATIONS

First office action received in the counterpart Taiwan application 112118361, mailed on Feb. 5, 2024.

* cited by examiner

*Primary Examiner* — Nicholas J Tobergte
(74) *Attorney, Agent, or Firm* — Kilpatrick Townsend & Stockton LLP

(57) ABSTRACT

A memory device is provided in various embodiments. The memory device, in those embodiments, has an ovonic threshold switching (OTS) selector comprising multiple layers of OTS materials to achieve a low leakage current and as well as relatively low threshold voltage for the OTS selector. The multiple layers can have at least one layer of low bandgap OTS material and at least one layer of high bandgap OTS material.

20 Claims, 7 Drawing Sheets

SELECTOR FOR MEMORY DEVICE

BACKGROUND

Memory devices are used in a wide range of applications for storing data. Operations of the memory device such as the read and write operations are performed through bit lines and word lines being coupled to each memory cell of the memory device. However, the parasitic resistance existed in the bit lines, word lines and circuitry coupled to the memory cell may result in performance degradation of the memory device. For example, the parasitic resistance may decrease a margin between a first logic state and a second logic state of the memory cell, thereby increasing a risk of errors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
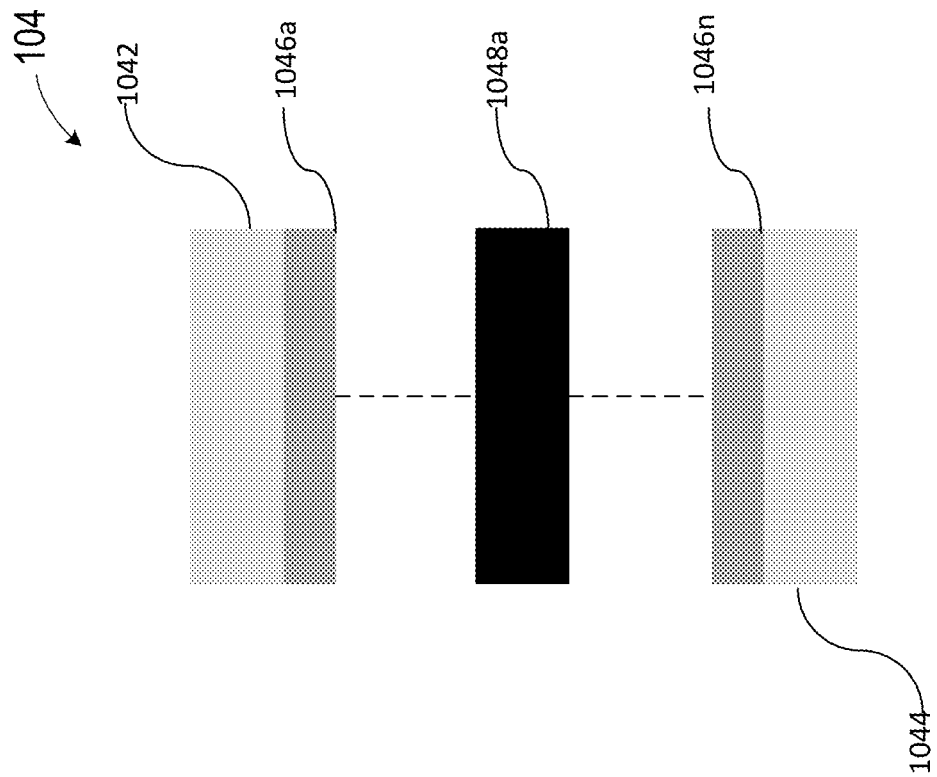
FIG. 1B illustrates one example of an OTS selector shown in FIG. 1A in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Phase Change Memory (PCM) devices are designed to exploit so-called phase-change materials that can be switched reversibly between amorphous and crystalline phases of different electrical resistivity. The amorphous phase tends to have high electrical resistivity, while the crystalline phase exhibits a low resistivity—for example, three to four orders of magnitude lower than that of the amorphous phase. This large resistance contrast is used to store information in PCM (the high-resistance state can represent a logical '0' while the lower resistance state can represent a logical '1'). Thus, a PCM device comprises a layer of phase-change material sandwiched between two metal electrodes—often knowns as the top electrode (TE) and bottom electrode.

For example, a type of PCM device comprises a phase-change material having an amorphous region and a crystalline region in a high-resistance amorphous state. For instance, the amorphous region can have a mushroom shape in the high resistive state. In that example, a low current pulse (SET) can be applied to bring the PCM device to a low-resistance crystalline state, where the amorphous region becomes crystalized and thus the entire phase-change material is in the crystalline phase. Still in that example, a short high current pulse (RESET) can be applied to bring the PCM device to the high-resistance amorphous state Some materials exhibit a conductivity behavior under high electric field, called the ovonic threshold switching (OTS) effect. This OTS mechanism typically comprises a reversible transition between a highly resistive state (OFF state) and a conductive state (ON state) when a voltage applied on the material exceeds a critical threshold value, $V_{th}$. When the current is reduced below the holding current density, $J_h$, the material recovers its high resistance state. Taking advantage of this effect, a memory selector is designed to comprise an OTS material, which allows individual reading and programming of an individual memory point in a memory array. This memory selector is thus able to provide not only a large enough current to reversibly switch a PCM device from a highly resistive (amorphous) RESET state to the highly conductive (and crystalline) SET state but also a very low leakage current when the PCM device is unselected to avoid any undesired programming.

Figure 1A:
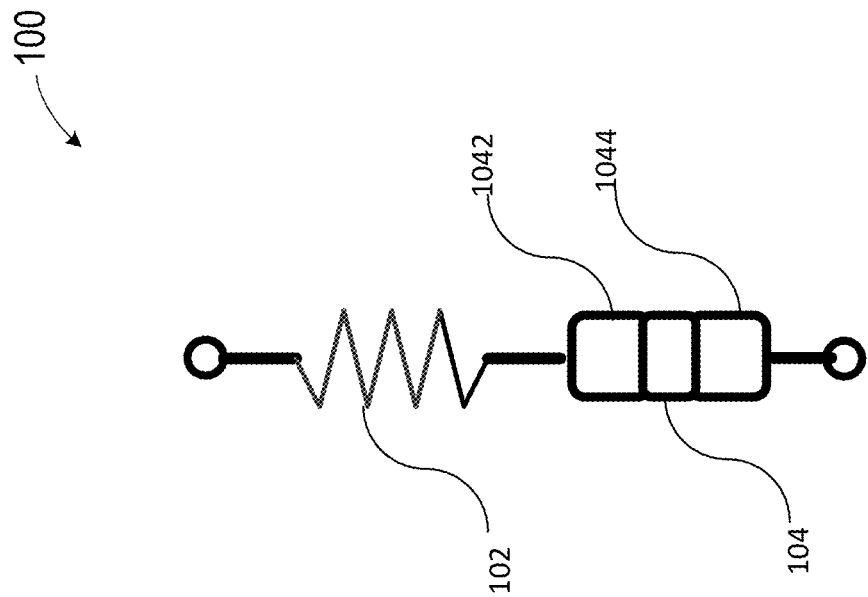
FIG. 1A illustrates one example of a memory device in accordance with one embodiment of the present disclosure.

FIG. 1A illustrates one example of a memory device 100 in accordance with one embodiment. In this example, the memory device 100 comprises a non-volatile memory (NVM) device 102 such as a PCM device, an OTS selector 104, and/or any other components. In this example, a voltage (V)/current pulse high enough can be applied to switch the OTS selector 104 ($V > V_{th}$) in its low-resistance SET state. Compared to phase-change materials, OTS materials are good glass formers to remain amorphous and highly resistive after each programming/reading operation. (B) I-V characteristics obtained from quasi-static (DC) measurement on prototypical GeSe-based OTS thin films in their as-fabricated state: GS, GSN, GSS, and GSSN. Whereas at low voltage the current flowing through the OTS material is very small (subthreshold current, or IOFF), when the applied voltage exceeds threshold voltage ($V_{th}$), the OTS material experiences a spectacular drop of resistivity by several orders of magnitude, enabling high current flow. When this high voltage is removed, the OTS material recovers its highly resistive state.

An OTS selector typically comprises an OTS-based film, such as germanium (Ge), Tellurium (Te), sulfide mineral (Sb), Selenium Ion (Se) and/or any materials, sandwiched in the middle of two electrodes—e.g., TE 1042 and BE 1044. As shown, the TE 1042 is connected to the NVM 102 in this example. For improving the OTS selector 104, efforts are put forth to achieve low leakage current. However, a reduced leakage current typically mans an increased threshold voltage $V_{th}$ for switching the OTS material in the OTS selector 104, where the OTS material is sandwiched between the OTS selector 104.

In various embodiments, materials of TE 1042 and BE 1044 may be respectively selected from a group consisting of aluminum (Al), titanium (Ti), copper (Cu), tungsten (W), platinum (Pt), palladium (Pd), osmium (Os), ruthenium (Ru), tantalum (Ta), or an alloy thereof, titanium nitride (TiN), tantalum nitride (TaN), tungsten nitride (WN), molybdenum nitride (MoN), TaSiN, TiSiN, WSiN, tungsten silicide, titanium silicide, cobalt silicide, zirconium silicide, platinum silicide, molybdenum silicide, copper silicide, nickel silicide, indium tin oxide (ITO), iridium oxide (IrO2), rhenium oxide (ReO2), rhenium trioxide (ReO3), or a combination thereof. The electrodes may be formed by suitable deposition processes, such as chemical vapor deposition (CVD), atomic layer deposition (ALD), physical vapor deposition (PVD), or the like or combinations thereof.

One insight provided by the present disclosure is that—instead of having one layer of OTS material in an OTS selector, multiple layers of OTS materials can be used in the OTS selector to achieve a low leakage current and as well as relatively low $V_{th}$ for the OTS selector. The multiple layers can have at least one layer of low bandgap OTS material and at least one layer of high bandgap OTS material.

FIG. 1B illustrates one example of an OTS selector 104 shown in FIG. 1A in accordance with one embodiment. As shown, in this example, the OTS selector 104 comprises multiple layers of low bandgap OTS layers, such as layers 1046*a*-1046*n*, and one or more high bandgap OTS layer, such as OTS layers 1048*a*. As can be seen, in this example, the low bandgap OTS layer 1046*a* is in direct contact with a lower side of the TE 1042. In this example, the low bandgap OTS layer 1046*n* is in direct contact with an upper side of the BE 1044. It should be understood although reference numbers 1046*a*-*n* are used to indicate a number of low bandgap OTS layers to be included in the OTS selector 104, they are not used to limit this number to be more than 2. It is understood that in various embodiments, the number of low bandgap OTS layers 1046*a*-*n* in the OTS selector 104 can be two layers.

In this example, as shown, the high bandgap OTS layer 1048*a* is disposed adjacent to the low bandgap OTS layer 1046*a*. In this example, the dotted line between low bandgap OTS layer 1046*a* and high bandgap OTS layer 1048*a* is to show there could one or more layers between those two layers. However, this is not intended to be limiting. As will be shown in another example, in some embodiments, the low bandgap OTS layer 1046*a* is in direct contact with the high bandgap OTS layer 1048*a*. Similarly, the dotted line between high bandgap OTS layer 1048*a* and low bandgap OTS layer 1046*n* is to show there could one or more layers between those two layers. However, this is not intended to be limiting. As will be shown in another example, in some embodiments, the low bandgap OTS layer 1046*a* is in direct contact with the high bandgap OTS layer 1048*n*.

In various embodiments, a thickness of low bandgap OTS layer 1046*a* and 1046*n* may be more or less the same or identical. In some embodiments, the thickness of the low bandgap OTS layer 1046*a* is between 1 to 50 nanometers (nm) and the thickness of the low bandgap OTS layer 1046*n* is also between 1 to 50 nm. In some embodiments, a thickness of the high bandgap OTS layer 1048*a* is more or less the same as at least one of the thickness of the low bandgap OTS layer 1046*a* or 1046*n*. In one embodiment, the thickness of the high bandgap OTS layer 1048*a* is identical to at least one the thickness of the low bandgap OTS layer 1046*a* or 1046*n*. In one embodiment, low bandgap OTS layers 1046*a*-*n* and high bandgap OTS layer 1048*a* have the same thickness. In some embodiments, the thickness of the high bandgap OTS layer 1048*a* is between 1-50 nm. It should be understood although the thickness of low bandgap OTS layers 1046*a*-*n* and high bandgap OTS layer 1048*a* are shown to be uniform in this example, it is not intended to be limiting. It is contemplated that one or more thickness of those layers may not be uniform in some other examples. For instance, the low bandgap OTS layer 1046*a* can have a convex shape and thus a non-uniform thickness. In that instance, an average thickness of the low bandgap OTS layer 1046*a* is between 1 to 50 nm. In another instance where the low bandgap OTS layer 1046's thickness is not uniform, a maximum thickness of the low bandgap OTS layer 1046*a* is between 1 to 50 nm.

In various embodiments, as their names suggest, the high bandgap OTS layer 1048*a* has a higher band gap than that of that of either the low bandgap OTS layer 1046*a*-*n*. In one non-limiting embodiment, a difference between the band gaps of the high bandgap OTS layer 1048*a* and either one of the low bandgap OTS layer 1046*a*-*n* is greater than 0.3 eV. Typically, one or more OTS materials can be determined to make up a particular OTS layer based on a desired threshold voltage and/or a desired leakage current. Considerations for such determination can include a specific threshold voltage for a low bandgap OTS layer ($V_{th\text{-}low\ bandgap\ OTS\ layer}$), a specific threshold voltage for a high bandgap OTS layer ($V_{th\text{-}high\ bandgap\ OTS\ layer}$), a desired difference between $V_{th\text{-}low\ bandgap\ OTS\ layer}$ and $V_{th\text{-}high\ bandgap\ OTS\ layer}$, a specific leakage current for a low bandgap OTS layer ($L_{low\ bandgap\ OTS\ layer}$), a specific leakage current for a high bandgap OTS layer ($L_{high\ bandgap\ OTS\ layer}$), a thickness of a low bandgap OTS layer and/or high bandgap OTS layer, and/or any other factors.

One insight provided by the present disclosure is that a thickness ratio between the low bandgap OTS layers 1046*a*-*n* and high bandgap OTS layer 1048*a* can affect the threshold voltage and leakage current for the entire OTS selector 104. It is understood that the leakage current of the OTS selector 104 increases proportionally to the thickness ratio of a low bandgap OTS layer 1046*a/n* and high bandgap OTS layer 1048*a*; and the threshold voltage ($V_{th}$) of the OTS selector 104 decreases proportionally to the thickness ratio of a low bandgap OTS layer 1046*a/n* and high bandgap OTS layer 1048*a*. Thus, for achieving a desired target or range of current leakage and/or threshold voltage for the OTS selector 104, a thickness ratio between a low bandgap OTS layer and a high bandgap OTS layer on the OTS selector 104 can be configured. In some embodiments, a ratio of a thickness of a low bandgap OTS layer to a thickness of a high bandgap OTS layer in the OTS selector 104 is between 0.01 and 100. For example, a ratio of the thickness of the low bandgap OTS layer 1046a and the thickness of the high bandgap OTS layer 1048a can be 0.01, 0.1, 1, 10, or 100 in various embodiments. However, it should be understood the thickness ratio between the low bandgap OTS layers and the high bandgap OTS layers in the OTS selector 104 is not specifically limited by the present disclosure; and it is a design choice based on one or more of the aforementioned considerations.

In various embodiments, low bandgap OTS layer 1046a-n can comprise one or more same OTS materials (low bandgap OTS layer materials), such as GeSe, SiTe, C Te, GeAsSeTeSi, and/or another OTS material. In some embodiments, the low bandgap OTS layer 1046a or the low bandgap OTS layer 1046n comprises at least one selected from the group of GeSe, SiTe/CTe, and GeAsSeTeSi. In various embodiments, the high bandgap OTS layer 1048a can comprise one or more OTS materials such as GeTe, ZnTe, GeAsTeSiN, GeSeN, GeSeAs, GeTeN, and/or any other OTS material. In some embodiments, the high bandgap OTS layer 1048a consists of at least one selected from the group comprises GeTe, ZnTe, and GeAsTeSiN. In some embodiments, the low bandgap OTS layer 1046a or the low bandgap OTS layer 1046b comprises at least one selected from the group comprising GeSe and GeTe, and the high bandgap OTS layer consists of at least one selected from the group comprising GeSeN, GeSeAs, and GeTeN.

In some embodiments, one or more of low bandgap OTS layers 1046a-n and the high bandgap OTS layer 1048a comprise different based materials in the OTS selector 104. In one embodiment, one or more of low bandgap OTS layers 1046a-n comprise GeSe, and the high bandgap OTS layer 1048a comprises GeTe in the OTS selector 104. In one embodiment, one or more of low bandgap OTS layers 1046a-n comprise SiTe/C Te, and the high bandgap OTS layer 1048a comprises ZnTe in the OTS selector 104. In one embodiment, one or more of low bandgap OTS layers 1046a-n comprise GeAsSeTeSi, and the high bandgap OTS layer 1048a comprises GeAsTeSiN in the OTS selector 104.

In some embodiments, one or more of low bandgap OTS layers 1046a-n and the high bandgap OTS layer 1048a comprise different based materials in the OTS selector 104. In one embodiment, one or more of low bandgap OTS layers 1046a-n comprise GeSe, and the high bandgap OTS layer 1048a comprises GeSeN in the OTS selector 104. In one embodiment, one or more of low bandgap OTS layers 1046a-n comprise GeSe, and the high bandgap OTS layer 1048a comprises GeSeAs in the OTS selector 104. In one embodiment, one or more of low bandgap OTS layers 1046a-n comprise GeTe, and the high bandgap OTS layer 1048a comprises GeTeN in the OTS selector 104.

Figure 1D:
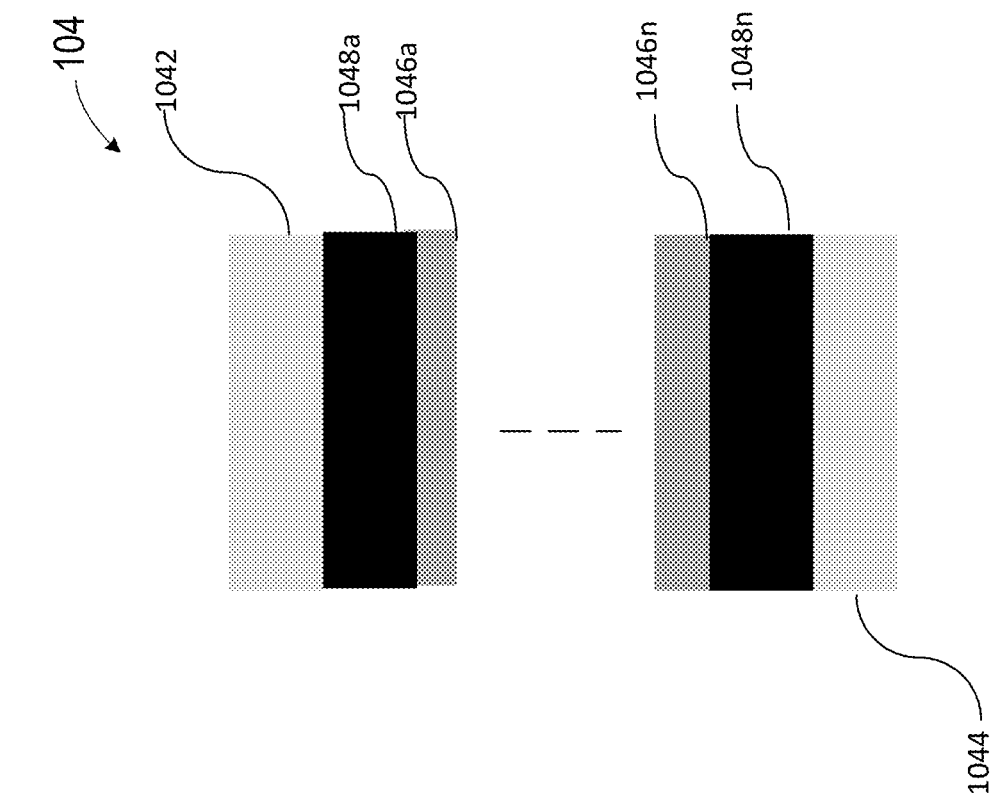
FIG. 1D illustrates another example configuration of OTS layers in the OTS selector shown in FIG. 1A.
Figure 1C:
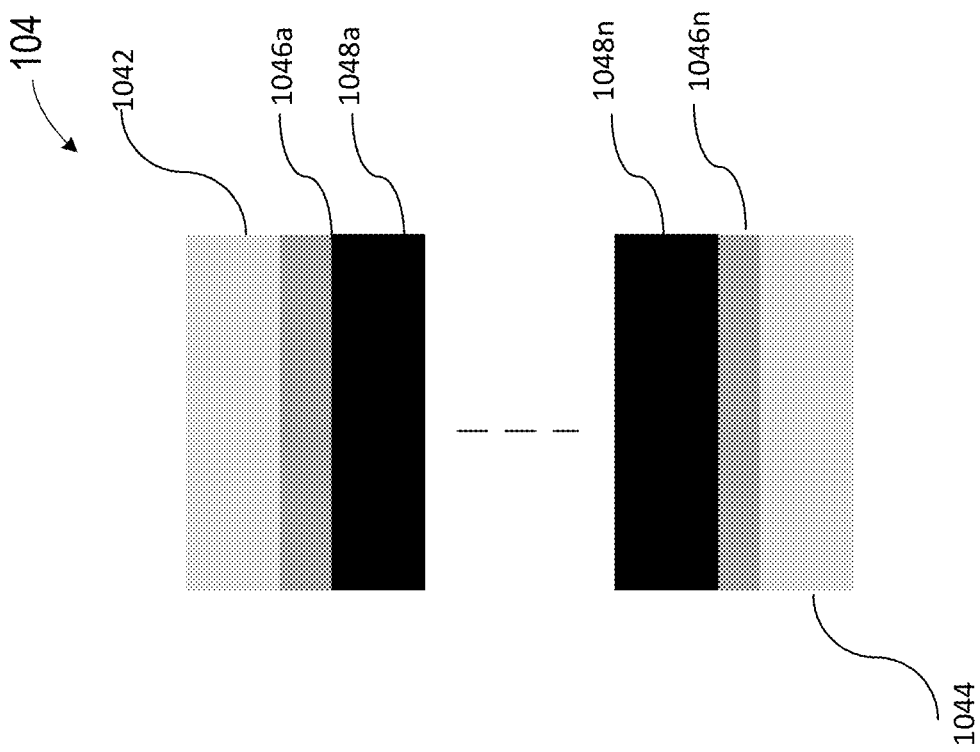
FIG. 1C illustrates another example configuration of OTS layers in the OTS selector shown in FIG. 1A.

Attention is now is directed to FIG. 1C, where another example configuration of OTS layers in the OTS selector 104 is illustrated. This example may be referred to as a sandwich layering structure, where the low bandgap OTS layers and high bandgap OTS layers alternate in the OTS selector 104 as shown. As can be seen, in this sandwich structure, the low bandgap OTS layer 1046a is in direct contact with the TE 1042 and the first high bandgap OTS layer 1048a; and the low bandgap OTS layer 1046n is in direct contact with the BE 1044 and the second high bandgap OTS layer 1048n. In between high bandgap OTS layers 1048a-n, there may be 0 or more OTS layers—low bandgap or high bandgap.

FIG. 1D illustrates another example configuration of OTS layers in the OTS selector 104. In this example, as can be seen, the high bandgap OTS layer 1048a is in direct contact with the TE 1042 and the low bandgap OTS layer 1046a; and the second high bandgap OTS layer 1048n is in direct contact with the BE 1044 and the low bandgap OTS layer 1046n. In between low bandgap OTS layers 1046a-n, there may be 0 or more OTS layers—low bandgap or high bandgap.

Figure 1F:
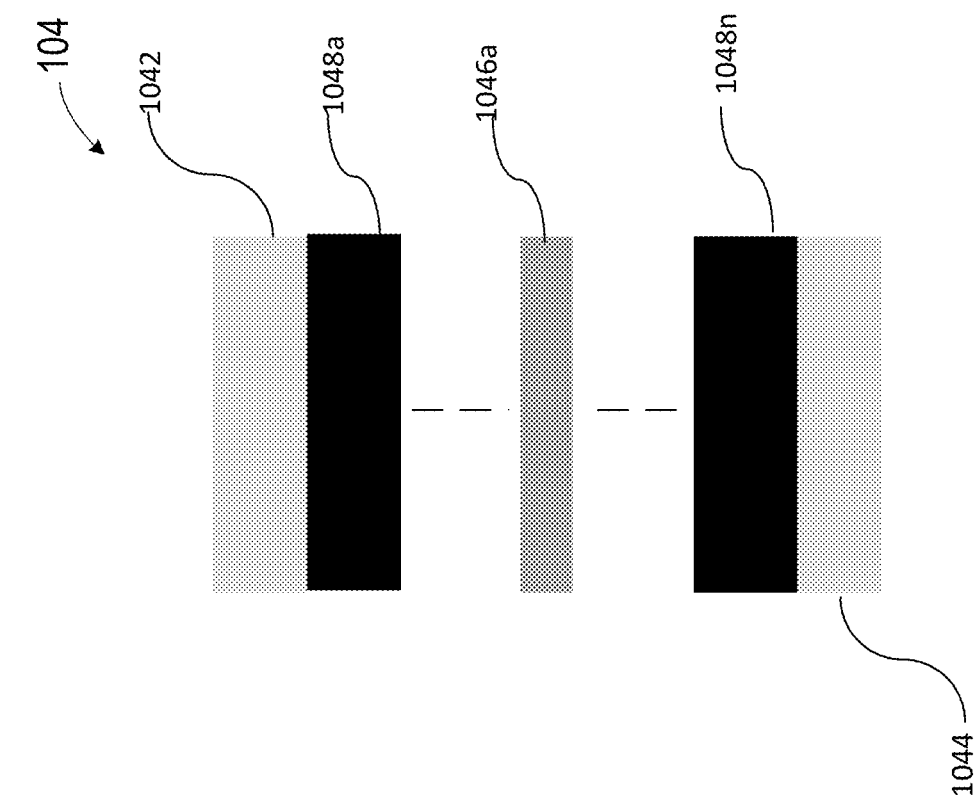
FIG. 1F illustrates yet another example configuration of OTS layers in the OTS selector shown in FIG. 1A.
Figure 1E:
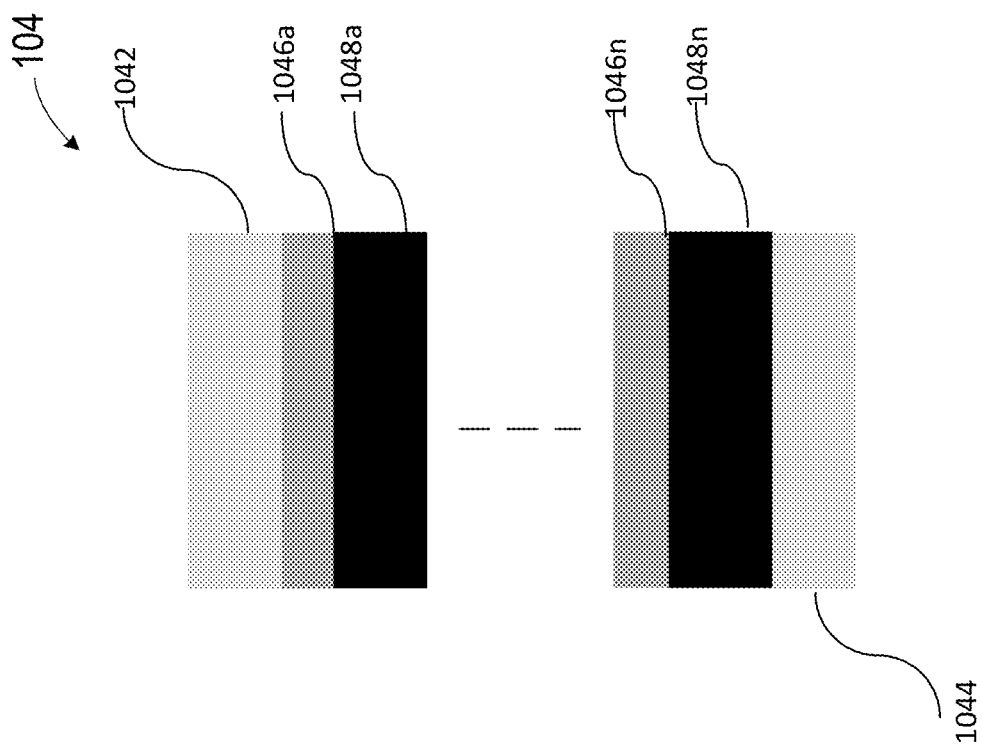
FIG. 1E illustrates another example configuration of OTS layers in the OTS selector shown in FIG. 1A.

FIG. 1E illustrates yet another example configuration of OTS layers in the OTS selector 104. In this example, as can be seen, the low bandgap OTS layer 1046a is in direct contact with the TE 1042 and the high bandgap OTS layer 1048a; and the high bandgap OTS layer 1048n is in direct contact with the BE 1044 and the low bandgap OTS layer 1046n. In between bandgap OTS layers 1048a and 1046n, there may be 0 or more OTS layers—low bandgap or high bandgap.

FIG. 1F illustrates still another example configuration of OTS layers in the OTS selector 104. In this example, as can be seen, the high bandgap OTS layer 1048a is in direct contact with the TE 1042; and the second high bandgap OTS layer 1048n is in direct contact with the BE 1044. In between high bandgap OTS layers 1048a-n, there is at least one low bandgap OTS layer 1046a and may be 0 or more OTS layers—low bandgap or high bandgap.

Figure 2B:
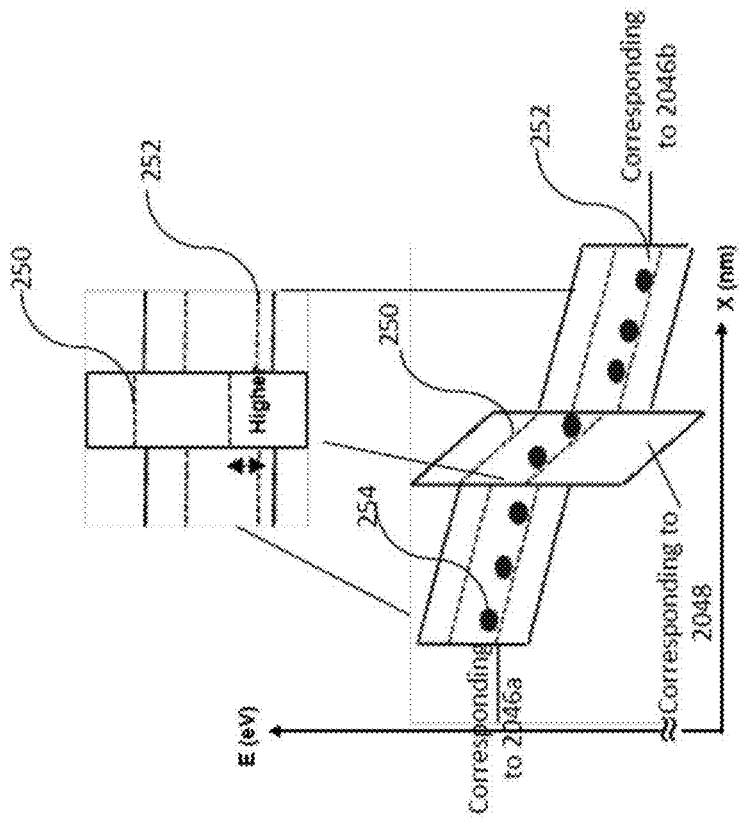
FIG. 2B illustrates a state of the OTS selector shown in FIG. 2A.
Figure 2A:
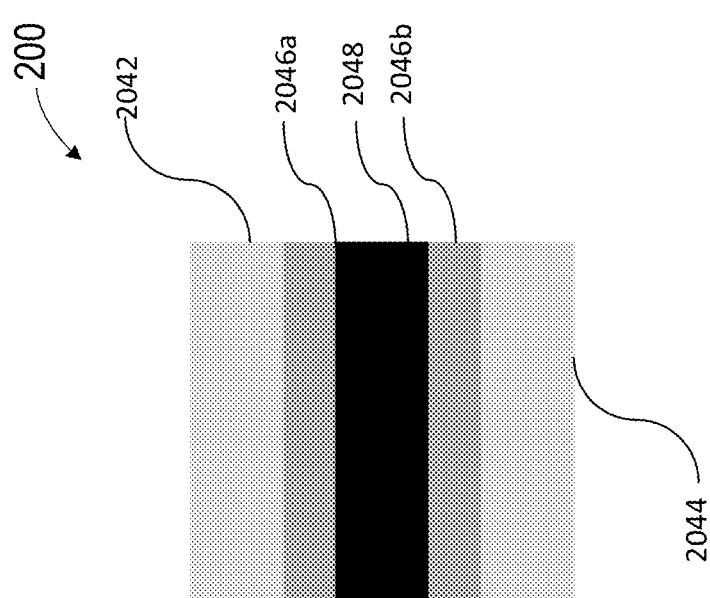
FIG. 2A illustrates one example of an OTS selector in accordance with one embodiment.

FIG. 2A illustrates one example of an OTS selector in accordance with one embodiment. In this example, as can be seen, the OTS selector 200 comprises a low bandgap OTS layer 2046a in direct contact with a TE 2042 of the OTS selector 200 and a high bandgap OTS layer 2048, which is in direct contact with a low bandgap OTS layer 2046n. The OTS selector 200 may be referred to as a Triple-Layer Structured OTS selector (TLS OTS). As will be described below, the OTS selector 200 is so structured to have an advantage of low leakage current and threshold voltage.

FIG. 2B illustrates a state of the OTS selector 200 shown in FIG. 2A. In this example, the OTS selector 200 is put under a low electric filed. Two kinds of traps were used in the test-one is a deep trap 252 and the other is shallow trap 250. As shown, energies of electrons 254 in between the shallow trap 250 and deep trap 252 are measured. It is observed, within the TLS OTS structure, the energy of deep traps is inversely proportional to leakage current. It is also observed that that the energy of deep traps with the TLS OTS structure is a function of the band the materials selected for the high bandgap OTS layer and/or low bandgap OTS layer in the OTS selector 200. In various embodiments, reduced leakage current is measured in the TLS OTS structure, which can be attributed to the high bandgap OTS layer 2048 added to the OTS selector 200.

Figure 2D:
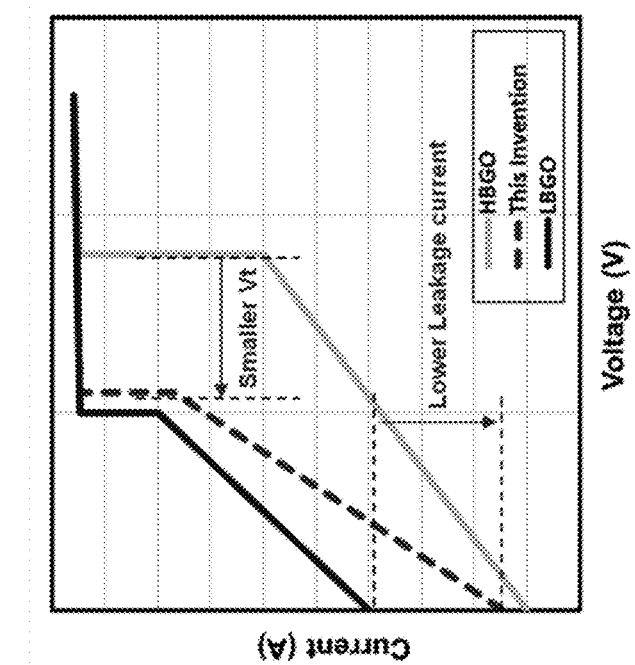
FIG. 2D illustrates an example diagram showing the OTS selector shown in FIG. 2A has a low leakage current and lower threshold voltage at the same time.
Figure 2C:
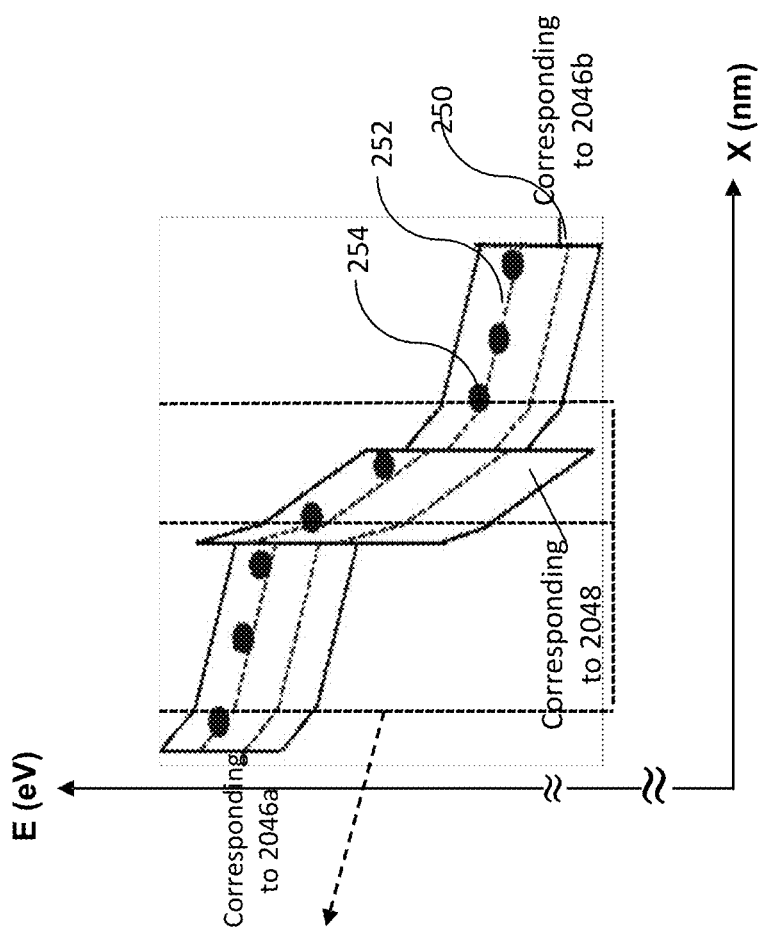
FIG. 2C illustrates another state of the OTS selector shown in FIG. 2A.

FIG. 2C illustrates another state of the OTS selector 200 shown in FIG. 2A. In this example, the OTS selector 200 is applied with voltages to measure threshold voltage for the OTS selector 200 ($V_{th\ TLS\ OTS}$). In general, the OTS selector 200 is driven by electric field. As shown, electrons 254 are transported by the shallow trap 250 when applied voltage is higher than the threshold voltage. It is observed that threshold voltage is proportional to a thickness of the OTS selector 200, and is determined by an OTS layer material with the largest band gap. As shown, the low bandgap OTS layers 2046a and 2046b provide lower effective threshold voltage to the OTS selector 200 due to their band gap properties.

FIG. 2D illustrates an example diagram showing the OTS selector 200 shown in FIG. 2A has a low leakage current and lower threshold voltage at the same time. As can be seen, the TLS OTS structured the OTS selector 200 has a lower leakage current as compared to a OTS selector that only has a low bandgap OTS layer and has a lower threshold voltage as compared to a OTS selector that only has a high bandgap OTS layer.

Figure 3:
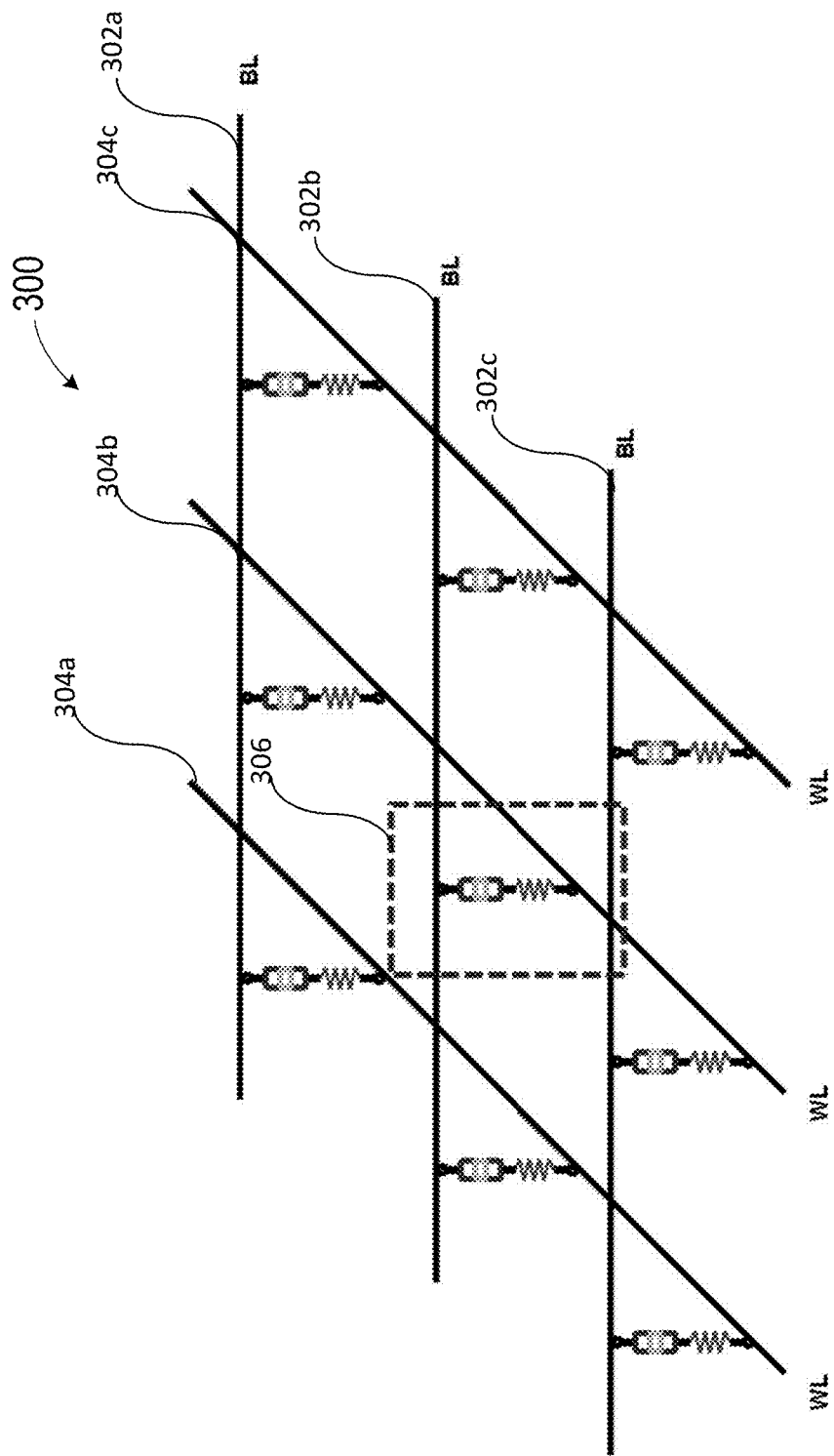
FIG. 3, illustrates an example of a memory array in accordance with the present disclosure.

Attention is now directed to FIG. 3, where an example of a memory array 300 in accordance with the present disclosure is illustrated. As can be seen, in this example, the memory array 300 comprises multiple bit lines, such as 302a, 302b, and 302c shown in this example; multiple word lines, such as 304a, 304b, and 304c shown in this example; and multiple memory devices 306. Examples of memory device 306 are shown in FIGS. 1 and 2. For instance, the memory device 306, in some embodiments, comprises an OTS selector such as the OTS selector 200 shown in FIG. 2 and a phase change memory, such as the NVM 102 shown in FIG. 1A. In that instance, the configuration of the memory device 306 is referred to as a 1S (OTS selector) and 1R (PCM) device. It is observed that the memory array 300 provides low power consumption in consequence of low leakage. By virtue of this property of memory array 300, lower $V_{write}$ may be applied to the memory devices 306. As compared to a single OTS layered OTS selector, $V_{write}$ being applied to the memory devices 306 is lower than that applied to memory device having the single OTS layered OTS selectors. Typically, when a particular memory device 306 is selected, a full $V_{write}$ is applied to that memory device 306; and when the particular memory device 306 is not selected, a half of $V_{write}$ is applied to that memory device 306. Therefore, it is observed that the memory array 300 has a lower power consumption compared to a memory array having memory devices comprising single OTS layered OTS selectors.

Still referring to FIG. 3, a window during which a $V_{read}$ ($V_{read}$ window) is applied to the particular memory device 306 is typically determined by a difference of the that memory device 306's PCM's $V_{set}$ and the OTS selector's $V_t$. For instance, the $V_{read}$ window can be determined using the following formula: $V_{read\ window} = V_{set\ NVM} - V_{t\ Selector}$. As mentioned above, because memory device 306 has a lower threshold voltage than a single OTS layered structure, the $V_{read}$ window for memory array 300 is bigger than a memory array having single OTS layered structures. This means memory array 300 has a bigger read margin for operation as compared to a memory array having single OTS layered structures.

Figure 4:
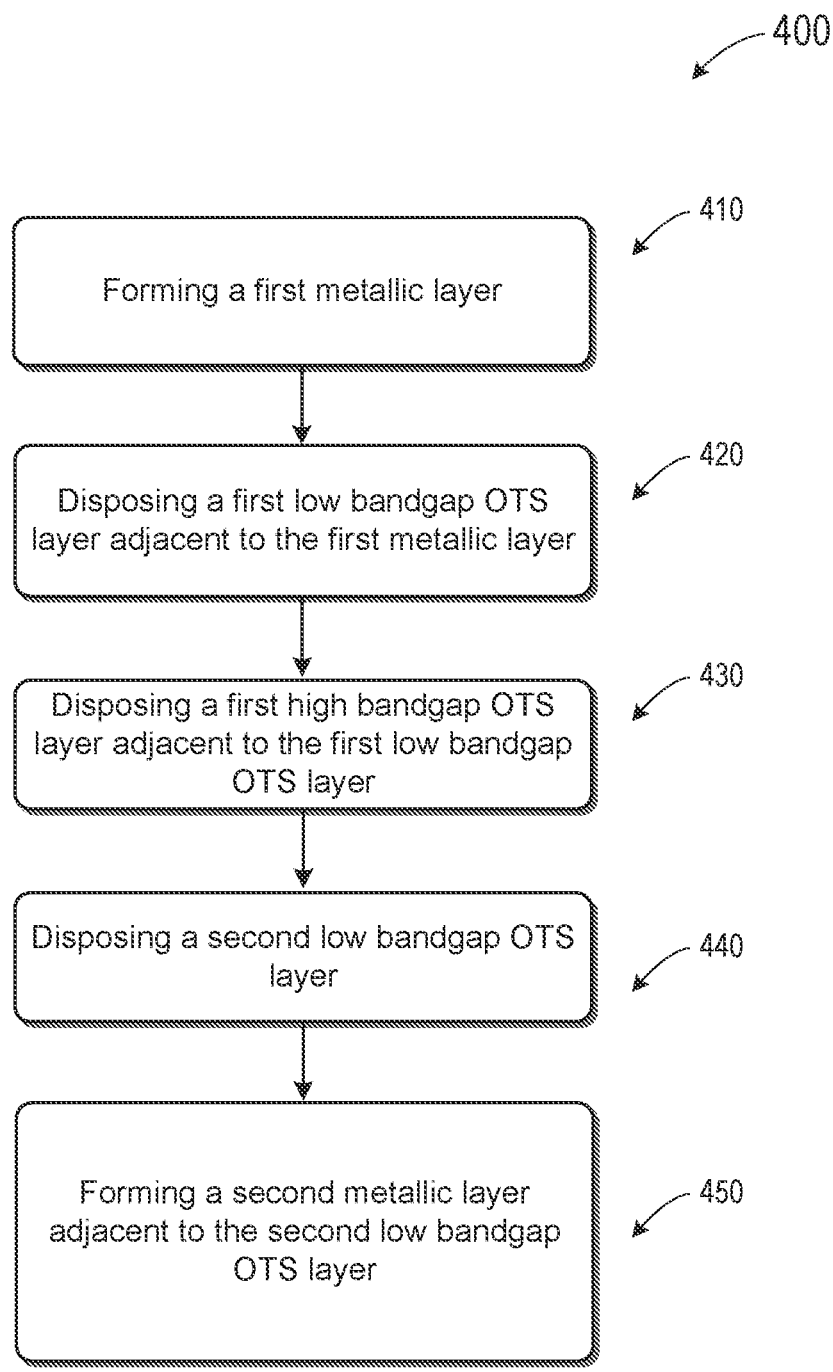
FIG. 4 is a flowchart illustrate a method for forming a memory device in accordance with some embodiments.

FIG. 4 is a flowchart illustrate a method 400 for forming a memory device in accordance with some embodiments. Elements shown in the method 400 outlined in FIG. 4 are described above in connection to FIGS. 1-3. At 410, a first metallic layer is formed for the memory device. An example of the first metallic layer is shown in FIG. 1A as BE 1044. Please refer to FIG. 1A for a description of that example first metallic layer.

At 420, a first low bandgap OTS layer is disposed adjacent to the first metallic layer formed at 410. As shown in various figures in FIG. 1, in those embodiments, the first low bandgap OTS layer, such as 1046n, is in direct contact with the first metallic layer.

At 430, a first high bandgap OTS layer is disposed adjacent to the first low bandgap OTS layer disposed at 420. As illustrated in various figures in FIGS. 1 and 2, in some embodiments, the first high bandgap OTS layer is disposed to have a direct contact with the first low bandgap OTS layer—for example—disposed on an upper side of the first low bandgap OTS layer. However, as also mentioned, this is not necessarily the only case. In some other examples, the first high bandgap OTS layer is disposed adjacent to the first low bandgap OTS layer, but not in direct contact with the first low bandgap OTS layer.

At 440, a second low bandgap OTS layer is disposed. As illustrated in various figures in FIGS. 1 and 2, in some embodiments, the second low bandgap OTS layer is disposed to have a direct contact with the first high bandgap OTS layer—for example—disposed on an upper side of the first high bandgap OTS layer. However, as also mentioned, this is not necessarily the only case. In some other examples, the second low bandgap OTS layer is disposed adjacent to the first high bandgap OTS layer, but not in direct contact with the first high bandgap OTS layer.

At 450, a second metallic layer is formed adjacent to the second low bandgap OTS layer. An example of the second metallic layer is shown in FIG. 1A as TE 1042. Please refer to FIG. 1A for a description of that example second metallic layer. In some embodiments, the second metallic layer is formed to have a direct contact with the second low bandgap OTS layer—for example—on top of the second low bandgap OTS layer.

As mentioned, in various examples, the first low bandgap OTS layer and the second low bandgap OTS layer have substantially the same thickness. In various examples, a ratio of a thickness of the first low bandgap OTS layer to a thickness of the high bandgap OTS layer is 0.01 to 100; and the first low bandgap OTS layer and the second low bandgap OTS layer have different thicknesses. In some embodiments, the first low bandgap OTS layer or the second low bandgap OTS layer comprises at least one selected from the group consisting of GeSe, SiTe/CTe, and GeAsSeTeSi. In some embodiments, the first low bandgap OTS layer or the second low bandgap OTS layer comprises at least one selected from the group consisting of GeSe, SiTe/CTe, and GeAsSeTeSi. In some embodiments, the high bandgap OTS layer comprises at least one selected from the group comprises GeTe, ZnTe, and GeAsTeSiN. In some embodiments, the first low bandgap OTS layer or the second low bandgap OTS layer comprises at least one selected from the group comprising GeSe and GeTe, and the high bandgap OTS layer consists of at least one selected from the group comprising GeSeN, GeSeAs, and GeTeN.

In accordance with some embodiments, a memory device is provided. In those embodiments, the memory device comprises a first metallic layer, a first low bandgap ovonic threshold switching (OTS) layer disposed in direct contact with the first metallic layer, a high bandgap OTS layer disposed adjacent to the first low bandgap OTS layer and in direct contact with the first low bandgap OTS layer, a second low bandgap OTS layer disposed adjacent to the high bandgap OTS layer and in direct contact with the high bandgap OTS layer, and a second metallic layer disposed adjacent to the second low bandgap OTS layer and in direct contact with the second low bandgap OTS layer. In those embodiments, the first metallic layer, the first low bandgap OTS layer, the high bandgap OTS layer, the second low bandgap OTS layer and the second metallic layer forming a phase change element arranged to have a threshold voltage to operate with a corresponding leakage current.

In accordance with some embodiments, a method for forming a memory device is provided. In those embodiments, the method comprises: forming a first metallic layer, disposing a first low bandgap ovonic threshold switching (OTS) layer in direct contact with the first metallic layer, disposing a high bandgap OTS layer disposed adjacent to the first low bandgap OTS layer in direct contact with the first low bandgap OTS layer, disposing a second low bandgap OTS layer adjacent to the high bandgap OTS layer in direct contact with the high bandgap OTS layer, and disposing a second metallic layer adjacent to the second low bandgap OTS layer in direct contact with the second low bandgap OTS layer. In those embodiments, the first metallic layer, the first low bandgap OTS layer, the high bandgap OTS layer, the second low bandgap OTS layer and the second metallic layer forming a phase change element arranged to have a threshold voltage to operate with a corresponding leakage current.

In accordance with some embodiments, a memory array is provided. The memory array comprises bit lines including a first bit line, word lines including a first word line, memory device including a first memory device. In those embodiments, the first memory device is located at an intersection of the first bit line intersecting the first world line, and wherein the first memory device comprises a phase change memory connected to an ovonic threshold switching (OTS) selector; and the first memory device comprises a phase change memory connected to an ovonic threshold switching (OTS) selector. In those embodiments, the OTS selector comprises a first metallic layer, a first low bandgap OTS layer disposed in direct contact with the first metallic layer, a high bandgap OTS layer disposed adjacent to the first low bandgap OTS layer and in direct contact with the first low bandgap OTS layer, a second low bandgap OTS layer disposed adjacent to the high bandgap OTS layer and in direct contact with the high bandgap OTS layer, and a second metallic layer disposed adjacent to the second low bandgap OTS layer and in direct contact with the second low bandgap OTS layer. In those embodiments, the first metallic layer, the first low bandgap OTS layer, the high bandgap OTS layer, the second low bandgap OTS layer and the second metallic layer forming a phase change element arranged to have a threshold voltage to operate with a corresponding leakage current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
    a first metallic layer;
    a first low bandgap ovonic threshold switching (OTS) layer disposed in direct contact with the first metallic layer;
    a high bandgap OTS layer disposed adjacent to the first low bandgap OTS layer and in direct contact with the first low bandgap OTS layer;
    a second low bandgap OTS layer disposed adjacent to the high bandgap OTS layer and in direct contact with the high bandgap OTS layer; and
    a second metallic layer disposed adjacent to the second low bandgap OTS layer and in direct contact with the second low bandgap OTS layer; and, wherein the first metallic layer, the first low bandgap OTS layer, the high bandgap OTS layer, the second low bandgap OTS layer and the second metallic layer forming a phase change element arranged to have a threshold voltage to operate with a corresponding leakage current.

2. The memory device of claim 1, wherein the first low bandgap OTS layer and the second low bandgap OTS layer have substantially the same thickness.

3. The memory device of claim 2, wherein a ratio of a thickness of the first low bandgap OTS layer to a thickness of the high bandgap OTS layer is 0.01 to 100.

4. The memory device of claim 1, wherein the first low bandgap OTS layer and the second low bandgap OTS layer have different thicknesses.

5. The memory device of claim 1, wherein the first low bandgap OTS layer or the second low bandgap OTS layer comprises at least one selected from the group consisting of GeSe, SiTe/CTe, and GeAsSeTeSi.

6. The memory device of claim 1, wherein the high bandgap OTS layer comprises at least one selected from a group comprises GeTe, ZnTe, and GeAsTeSiN.

7. The memory device of claim 1, wherein the first low bandgap OTS layer or the second low bandgap OTS layer comprises at least one selected from a group comprising GeSe and GeTe, and the high bandgap OTS layer consists of at least one selected from a group comprising GeSeN, GeSeAs, and GeTeN.

8. A method for forming a memory device, the method comprising:
    forming a first metallic layer;
    disposing a first low bandgap ovonic threshold switching (OTS) layer in direct contact with the first metallic layer;
    disposing a high bandgap OTS layer disposed adjacent to the first low bandgap OTS layer in direct contact with the first low bandgap OTS layer;
    disposing a second low bandgap OTS layer adjacent to the high bandgap OTS layer in direct contact with the high bandgap OTS layer; and
    disposing a second metallic layer adjacent to the second low bandgap OTS layer in direct contact with the second low bandgap OTS layer; and, wherein the first metallic layer, the first low bandgap OTS layer, the high bandgap OTS layer, the second low bandgap OTS layer and the second metallic layer forming a phase change element arranged to have a threshold voltage to operate with a corresponding leakage current.

9. The method of claim 8, wherein the first low bandgap OTS layer and the second low bandgap OTS layer have substantially the same thickness.

10. The method of claim 9, wherein a ratio of a thickness of the first low bandgap OTS layer to a thickness of the high bandgap OTS layer is 0.01 to 100.

11. The method of claim 8, wherein the first low bandgap OTS layer and the second low bandgap OTS layer have different thicknesses.

12. The method of claim 8, wherein the first low bandgap OTS layer or the second low bandgap OTS layer comprises at least one selected from a group comprising GeSe, SiTe/CTe, and GeAsSeTeSi.

13. The method of claim 8, wherein the high bandgap OTS layer comprises at least one selected from a group comprising GeTe, ZnTe, and GeAsTeSiN.

14. The method of claim 8, wherein the first low bandgap OTS layer or the second low bandgap OTS layer comprises at least one selected from a group comprising GeSe and GeTe, and the high bandgap OTS layer consists of at least one selected from a group comprising GeSeN, GeSeAs, and GeTeN.

15. A memory array comprising:
bit lines including a first bit line, word lines including a first word line, and memory devices including a first memory device, wherein the first memory device is located at an intersection of the first bit line intersecting the first world line, and wherein the first memory device comprises a phase change memory connected to an ovonic threshold switching (OTS) selector, wherein the OTS selector comprises:
a first metallic layer;
a first low bandgap OTS layer disposed in direct contact with the first metallic layer;
a high bandgap OTS layer disposed adjacent to the first low bandgap OTS layer and in direct contact with the first low bandgap OTS layer;
a second low bandgap OTS layer disposed adjacent to the high bandgap OTS layer and in direct contact with the high bandgap OTS layer; and
a second metallic layer disposed adjacent to the second low bandgap OTS layer and in direct contact with the second low bandgap OTS layer; and, wherein the first metallic layer, the first low bandgap OTS layer, the high bandgap OTS layer, the second low bandgap OTS layer and the second metallic layer forming a phase change element arranged to have a threshold voltage to operate with a corresponding leakage current.

16. The memory array of claim 15, wherein the first low bandgap OTS layer and the second low bandgap OTS layer have substantially the same thickness.

17. The memory array of claim 16, wherein a ratio of a thickness of the first low bandgap OTS layer to a thickness of the high bandgap OTS layer is 0.01 to 100.

18. The memory array of claim 15, wherein the first low bandgap OTS layer and the second low bandgap OTS layer have different thicknesses.

19. The memory array of claim 15, wherein the first low bandgap OTS layer or the second low bandgap OTS layer comprising at least one selected from a group of GeSe, SiTe/CTe, and GeAsSeTeSi.

20. The memory array of claim 15, wherein the high bandgap OTS layer comprising at least one selected from a group of GeTe, ZnTe, and GeAsTeSiN.

* * * * *